(12) United States Patent
Magome

(10) Patent No.: US 6,265,119 B1
(45) Date of Patent: *Jul. 24, 2001

(54) METHOD FOR PRODUCING SEMICONDUCTOR DEVICES

(75) Inventor: Nobutaka Magome, Kawasaki (JP)

(73) Assignee: Nikon Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/942,486

(22) Filed: Oct. 2, 1997

Related U.S. Application Data

(63) Continuation of application No. 08/577,116, filed on Dec. 22, 1995, now abandoned.

(30) Foreign Application Priority Data

Feb. 17, 1995 (JP) .................................................. 7-053392

(51) Int. Cl.[7] ...................................................... G03F 9/00
(52) U.S. Cl. .................. 430/30; 430/22; 430/5; 430/394; 356/401
(58) Field of Search .............................. 356/401; 430/5, 430/22, 30, 394

(56) References Cited

U.S. PATENT DOCUMENTS

| | | | |
|---|---|---|---|
| 4,642,672 | * | 2/1987 | Kitakata .................................. 430/22 |
| 5,172,190 | * | 12/1992 | Kaiser ..................................... 356/401 |
| 5,216,257 | * | 6/1993 | Brueck et al. ......................... 356/401 |

FOREIGN PATENT DOCUMENTS

| | | | |
|---|---|---|---|
| 56-102823 | | 8/1981 | (JP) . |
| 59-94418 | * | 5/1984 | (JP) ..................................... 430/22 |
| 59-130434 | * | 7/1984 | (JP) ..................................... 430/22 |
| 60-211941 | | 10/1985 | (JP) . |
| 2-27711 | * | 1/1990 | (JP) . |
| 2-065149 | * | 3/1990 | (JP) . |
| 3-192741 | * | 8/1991 | (JP) ..................................... 430/22 |

OTHER PUBLICATIONS

Thompson et al., "Introduction to Microlithography" ACS symposium pp. 4–7, 1983.*
Elliott, David J., "Integrated Circuit Fabrication Technology" McGraw–Hill, pp. 1–3 and 43–61, 1982.*
Thompson et al. "introduction to Microlithography", pp. 16–23, 1983.*
Thompson et al. "Introduction to Microlithography" (© 1983) pp. 16–23.*

* cited by examiner

Primary Examiner—Martin J. Angebranndt
(74) Attorney, Agent, or Firm—Oliff & Berridge PLC

(57) ABSTRACT

Disclosed is a method for producing semiconductor devices by using a lithography technique. Process control marks, which are necessary for overlay exposure and so on, are formed, prior to formation of bonding pads, in a photolithography step on bonding pad areas intended to be finally used as continuity areas for deriving external wiring or on areas in the vicinity thereof. The process control marks are formed on the bonding pad areas having a much broader superficial content than scribe line areas. Therefore, even if the number of process control marks to be used increases, or if the marks themselves become large, all of the marks can be formed without using the scribe line areas.

16 Claims, 4 Drawing Sheets

METHOD FOR PRODUCING SEMICONDUCTOR DEVICES

This is a Continuation of application Ser. No. 08/577,116 filed Dec. 22, 1995 now abandoned.

FIELD OF THE INVENTION

The present invention relates to a method for producing semiconductor devices by a photolithography step.

DESCRIPTION OF THE RELATED ART

In order to produce semiconductor devices, photolithography techniques have been hitherto used, in which a mask (reticle) with a circuit pattern formed thereon is illuminated with light to perform transfer (exposure) onto a semiconductor substrate (wafer) with a photosensitive material applied thereon. In such a photolithography step, positional adjustment for exposure has been performed by introducing process control marks indispensable for production such as alignment marks, registration marks, focus marks, and line width control marks into, for example, spaces between chips formed on a wafer, namely onto scribe lines.

As the integration of semiconductors increases, and the line width of patterns used is finely miniaturized, it is required to use more accurate positional adjustment techniques (alignment techniques) for reticles and wafers, automatically focusing techniques (autofocus techniques), and high performance optical techniques. In response to the requirement, the variety and the number of process control marks to be used have increased.

However, in the conventional art as described above, these marks were imprinted on the spaces between chips or on the scribe lines, and hence the superficial content and the width for imprinting the marks were restricted. Accordingly, it becomes difficult to imprint a desired number of marks with desired sizes.

On the other hand, it is desirable to make the line width of the scribe lines as narrow as possible, because a cutting speed of a dicing saw for cutting a wafer along the scribe lines can become faster and the number of acquirable chips can increase with narrower line width of the scribe lines. Accordingly, it seems that the demand to narrow the line width of the scribe lines will become stronger in future.

SUMMARY OF THE INVENTION

An object of the present invention is to provide a method for producing semiconductor devices in which all control marks to be used can be easily imprinted on a wafer, and thus the line width of scribe lines can be made narrow.

According to the present invention, there is provided a method for producing semiconductor devices including a photolithography step, comprising:

forming process control marks in the photolithography step on areas on a semiconductor substrate which are intended to be finally used as continuity areas for deriving external wiring or on areas in the vicinity thereof, the process control marks being used in the photolithography step; and forming the continuity areas after forming the process control marks.

According to the present invention, the process control marks are formed on the areas on the wafer intended to be finally used as the continuity areas for deriving the external wiring, for example, on bonding pad areas, or on the areas in the vicinity thereof. Thus the process control marks are formed on the areas having a much broader superficial content as compared with the scribe line areas. Therefore, even if the number of process control marks to be used is increased, or if the marks themselves are large, all of them can be easily imprinted on the wafer. In addition, no mark remains at all on a formed chip pattern because insulating layers and bonding pads are formed in the following steps on the process control marks which were formed on the bonding pad areas. The process control marks may be formed between the areas on which the bonding pads are intended to be formed.

According to another aspect of the present invention, there is provided a method for producing semiconductor devices by using photolithography, comprising the steps of:

illuminating a mask containing a circuit pattern for forming semiconductor devices to transfer the circuit pattern onto a semiconductor substrate;

illuminating a mask containing a process control mark pattern to transfer the process control mark pattern onto areas on the semiconductor substrate which are intended to be finally used as continuity areas for deriving external wiring or onto areas in the vicinity thereof;

performing positional adjustment necessary to transfer the circuit pattern or another circuit pattern onto the semiconductor substrate by using the process control marks transferred onto the semiconductor substrate; and forming the continuity areas after performing the positional adjustment.

In the present invention, the process control marks include, for example, alignment marks, registration marks, focus marks, and line width control marks. When two types of marks are used, namely marks which should be accommodated in the scribe line areas due to their properties, and marks which are not so, enough area for the former can be easily obtained on the scribe line by forming the latter on the bonding pad area. The photolithography is performed in accordance with an exposure system, such as, the step-and-repeat system, the slit scan system, the mirror projection system, the proximity system, and the contact system.

According to still another aspect of the present invention, there is provided a method for producing semiconductor devices, comprising the steps of:

illuminating a mask containing a circuit pattern for semiconductor devices to successively perform projection and exposure with the pattern through a projection optical system on a photosensitive semiconductor substrate in accordance with an exposure system in which stepping of the substrate and exposure are repeated by turns;

developing the circuit pattern subjected to the exposure; and forming continuity areas for deriving external wiring;

wherein, prior to forming the continuity areas, a mask containing a process control mark pattern is illuminated to transfer the process control mark pattern onto areas on the semiconductor substrate which are intended to be finally used as the continuity areas for deriving the external wiring or onto areas in the vicinity thereof and positional adjustment necessary for an exposure operation in the system is performed by using the process control marks transferred onto the semiconductor substrate.

DETAILED DESCRIPTION OF THE PREFERRED EMBODIMENT

The production method of the present invention will be described below with reference to accompanied drawings, however, the present invention is not limited thereto.

Figure 1:
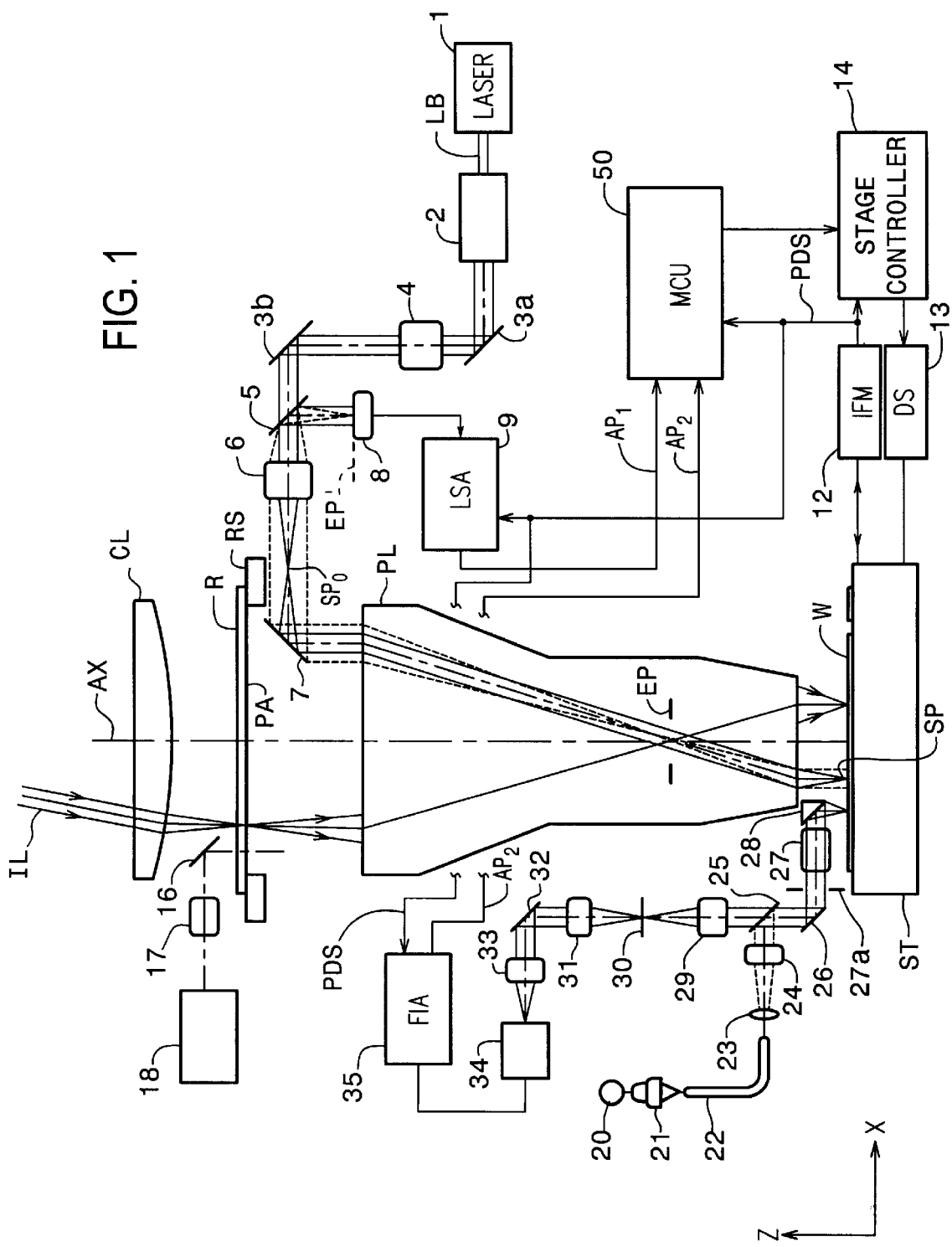
FIG. 1 shows an arrangement of a reduction projection type exposure apparatus used in a lithography step in a method of producing semiconductor devices according to the present invention.

FIG. 1 shows an arrangement of a reduction projection type exposure apparatus used in a lithography step in a method of producing semiconductor devices according to the present invention. Now the reduction projection type exposure apparatus will be explained.

In FIG. 1, illumination light for exposure IL (g-ray, i-ray from a mercury lamp, or ultraviolet pulse beam from an excimer laser beam source) passes through a condenser lens CL, and irradiates a pattern area PA on a reticle R with uniform illuminance distribution. The illumination light IL passed through the pattern area PA comes into a projection lens PL which is, for example, telecentric on both sides (or one side), and it arrives at a wafer W. In this embodiment, the projection lens PL is optimally corrected for its aberration relative to a wavelength of the illumination light IL, and the reticle R and the wafer W are conjugate with each other under the wavelength. The reticle R undergoes Koehler illumination by the illumination light IL. A light source image is formed at a center of a pupil EP of the projection lens PL.

The reticle R is held on a reticle stage RS which is finely movable two-dimensionally. The reticle R is positioned relative to an optical axis AX of the projection lens PL in accordance with detection of reticle alignment marks formed on a periphery of the reticle by a reticle alignment system which comprises a mirror 16, an objective lens 17, and a mark detecting system 18.

On the other hand, the wafer W is placed on a wafer stage ST which is movable two-dimensionally by the action of a driving system 13. The coordinate value of the wafer stage ST is successively measured by an interferometer (IFM) 12. A stage controller 14 controls the driving system (DS) 13 on the basis of measured coordinate values from the interferometer 12 and so on, and thus it controls the wafer stage ST for its movement and positioning. The stage controller 14 is under the control of a main control unit (MCU) 50.

In this embodiment, an alignment optical system of the TTL system (through the lens system) is provided which comprises a laser beam source 1, a beam-shaping optical system 2, mirrors 3a, 3b, a lens system 4, a beam splitter 5, an objective lens 6, a mirror 7, a light-receiving element 8, an LSA (laser step alignment) operation unit 9, and the projection lens PL. Now the alignment optical system of the TTL system will be explained together with functions of each of the components.

A beam LB emitted from the laser beam source 1 is a red light beam such as an He-Ne laser. A resist layer on the wafer W is not photosensitive thereto. The beam LB passes through the beam-shaping optical system 2 comprising a cylindrical lens and so on, and it comes into the objective lens 6 through the mirror 3a, the lens system 4, the mirror 3b, and the beam splitter 5. The beam LB outgoing from the objective lens 6 is reflected by the mirror 7 provided obliquely at 45° under the reticle R, and it comes into a periphery of a visual field of the projection lens PL in parallel to the optical axis AX. Further, the beam LB passes through the center of the pupil EP of the projection lens PL, and it radiates the wafer W vertically.

The beam LB is collected in a space on the optical path between the objective lens 6 and the projection lens PL by the action of the beam-shaping optical system 2, forming a slit-shaped light spot SP0. The light spot SP0 is subjected to image reconstruction on the wafer W as a spot SP through the projection lens PL. The mirror 7 is fixed so that it is outside a periphery of the pattern area PA on the reticle R, and it is within the visual field of the projection lens PL. Therefore, the slit-shaped light spot SP formed on the wafer W is located outside a projection image of the pattern area PA.

In order to detect marks (including alignment marks as described below) on the wafer W by using the light spot SP, the wafer stage ST is moved horizontally with respect to the light spot SP. When the light spot SP and the marks are relatively scanned specular reflection light, scattering light, and diffraction light are generated from the marks, and the amount of light changes depending on a relative position between the marks and the light spot. Optical information thereon travels inversely along the traveling path of the beam LB in an order of the projection lens PL, the mirror 7, and the objective lens 6, which is reflected by the beam splitter 5, and arrives at the light-receiving element 8. The light-receiving element 8 has its light-receiving surface which is located in a plane EP approximately conjugate with the pupil EP of the projection lens PL, which receives only the scattering light and the diffraction light from the marks, and does not receive the specular reflection light.

Photoelectric signals from the light-receiving element 8 as described above are inputted into the LSA operation unit 9 respectively together with a positional measurement signal PDS from the interferometer 12, and thus information AP1 on the mark position is generated. When the wafer marks are scanned with respect to the light spot SP, photoelectric signal waveforms are obtained from the light-receiving element 8, and they are sampled and stored by the LSA operation unit 9 on the basis of the positional measurement signal PDS. The waveforms are analyzed so that the information AP1 is generated as a coordinate position of the wafer stage ST when a mark center coincides with a light spot center, and it is outputted to the main control unit 50.

Lines are illustrated along the optical path of the alignment optical system of the TTL system in FIG. 1, wherein solid lines represent a relation of image formation with respect to the wafer W, and dotted lines represent a relation of conjugation with respect to the pupil EP.

In this embodiment, an alignment system of the off-axis system is also provided as another mark position detecting means. Now this alignment system of the off-axis system will be explained for the function of each of its components.

Light emitted from a halogen lamp 20 is collected on one end surface of an optical fiber 22 by a condenser lens 21. The light passed through the fiber 22 passes through a filter 23 for cutting light components of a sensitive wavelength region for the resist layer (short wavelength region) and an infrared region, and it arrives at a half mirror 25 through a lens system 24. The illumination light reflected thereby is reflected by a mirror 26 approximately horizontally, and then comes into an objective lens 27. The light is reflected by a prism (mirror) 28 which is fixed in the vicinity of a lower portion of a lens barrel of the projection lens PL so that the visual field of the projection lens PL is not intercepted. Thus the wafer W is irradiated vertically. Although not shown in the illustration, an appropriate illumination field diaphragm is provided at a position conjugate with the wafer W relative to the objective lens 27 in the optical path from an emitting end of the fiber 22 to the objective lens 27. The objective lens 27 is of a telecentric system with a plane 27a of its aperture diaphragm (identical with a pupil) on which an image of the emitting end of the fiber 22 is formed. Thus Koehler illumination is provided. The objective lens 27 has its optical axis which is established to become vertical on the wafer W so that no discrepancy occurs for the mark position during detection of the mark due to inclination of the optical axis.

Figure 2:
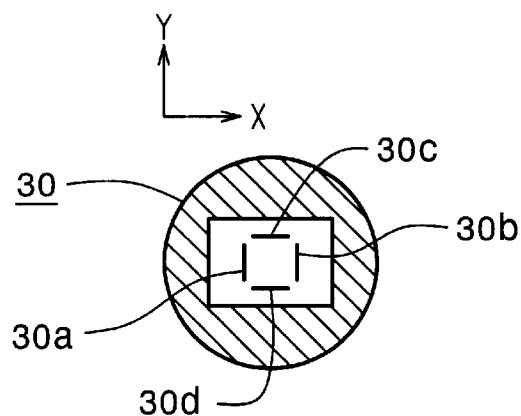
FIG. 2 shows a state of an index plate 30 in FIG. 1 as viewed from a side of a lens system 29.

The reflection light from the wafer W passes through the objective lens 27 and the half mirror 25, and it is focused on an index plate 30 by a lens system 29. The index plate 30 is arranged to be conjugate with the wafer W by means of the objective lens 27 and the lens system 29, and it has linear index marks 30a, 30b, 30c, 30d extending in X and Y directions respectively in a rectangular transparent window as shown in FIG. 2. Therefore, an image of the mark on the wafer W is formed in the transparent window of the index plate 30. An image comprising the image of the wafer mark and the index marks 30a, 30b, 30c, 30d is formed on an image pick-up device 34 such as a CCD camera through relay systems 31, 33, and a mirror 32. A video signal from the image pick-up device 34 is inputted into an FIA (field image alignment) operation unit 35 together with the positional measurement signal PDS from the interferometer 12. The FIA operation unit 35 determines discrepancy of the mark image with respect to the index marks 30a–30d on the basis of a waveform of the video signal, and it outputs information AP2 on the position of the wafer stage ST for the detection of the mark center when the image of the wafer mark is accurately located on a center of the index marks 30a–30d in accordance with a stop position of the wafer stage ST represented by the positional measurement signal PDS. The information AP2 is inputted into the main control unit 50.

The main control unit 50 controls the stage controller 14, etc. on the basis of the information AP1, AP2, and the positional measurement signal PDS from the interferometer 12 to perform alignment for the wafer W and the reticle R. The main control unit 50 also has a function to control an exposure controller (not shown) and so on. Thus the reticle R is illuminated with the illumination light IL, and the pattern image of the reticle R is projected and focused on the wafer W through the projection lens PL.

In FIG. 1, one set of the alignment system of the TTL system is illustrated (1, 2, 3a, 3b, 4, 5, 6, 7, 8). However, actually, one additional set is further provided in a direction perpendicular to the plane of paper, and a similar light spot is formed within the projection image plane. These two light spots are slit-shaped, and elongated lines thereof in their longitudinal directions are directed to the optical axis AX.

In FIG. 1, the detection center (center of the index plate 30) of the alignment system of the off-axis system is spaced apart from the center of the projection lens. For this reason, the system is provided on a straight line for connecting the measuring position of the interferometer 12 and the center of the projection lens, namely on a comparator axis (center line of the light beam of the interferometer), and thus the Abbe error (off-axis error due to inclination of the stage) is suppressed to the minimum.

FIG. 1 shows only one set of the alignment systems of the TTL and the off-axis systems. However, actually, each one set of the alignment systems of the TTL and the off-axis systems is provided on X and Y comparator axes respectively as disclosed, for example, in Japanese Patent Laid-open No. 56-102823.

Next, a lithography step in the method for producing semiconductor devices according to the present invention will be explained, the lithography step being practiced by using the reduction projection type exposure apparatus described above.

(1) At first, a plurality of shot areas on the wafer W placed on the stage ST are successively exposed with the mask pattern (circuit pattern) and the alignment mark pattern formed on the reticle R in accordance with the step-and-repeat system. Thus chips (circuit patterns formed on the wafer) are formed on the plurality of shot areas respectively. Spaces between the chips are called scribe lines. Scribe lines in the X axis direction approximately parallel to an orientation flat, and scribe lines in a direction perpendicular to the orientation flat are formed on the wafer W. The plurality of chips are comparted on the wafer W by these scribe lines. Upon exposure, the alignment marks are formed on the scribe lines or on areas intended to be finally used as bonding pads depending on the position of the alignment marks included in the reticle R.

(2) A photosensitive material on the wafer W undergone exposure is developed, and then the reticle R is exchanged for another reticle in order to perform exposure for a second layer. During this procedure, the reticle R is positioned relative to the optical axis AX of the projection lens PL by detecting the reticle alignment marks by using the reticle alignment system, while the alignment marks affixed to the first shot areas on the wafer W are detected by the TTL alignment system to perform positional adjustment (alignment) with respect to the reticle R. This operation is performed because of the following reason. Namely, in production steps, it is necessary to perform exposure after positional adjustment of a pattern on the reticle to be subsequently formed with respect to a pattern having been formed on the wafer W, because it is necessary for circuit patterns of 10–20 layers to be accurately overlaid and formed in order to produce a semiconductor device.

After that, the shot areas on the wafer are successively exposed with the circuit pattern respectively in accordance with the step-and-repeat system in the same manner as the step (1). Every time when each of the shots is exposed, the alignment marks affixed to each of the exposure shot areas on the wafer W are detected by the TTL alignment system, and the reticle R and the pattern on the wafer W are subjected to relative positional adjustment.

(3) Exposure for a third layer and subsequent layers is subsequently repeated in accordance with the step-and-repeat system in the same manner. During this procedure, various process control marks to be used in the lithography step are formed on areas intended to be finally used as bonding pads, if necessary. In a final exposure step, the bonding pads are formed on the intended bonding pad areas.

Next, the formation of various process control marks on the wafer W in the steps (1) to (3) described above will be explained in further detail with reference to FIGS. 3 and 4.

Figure 3:
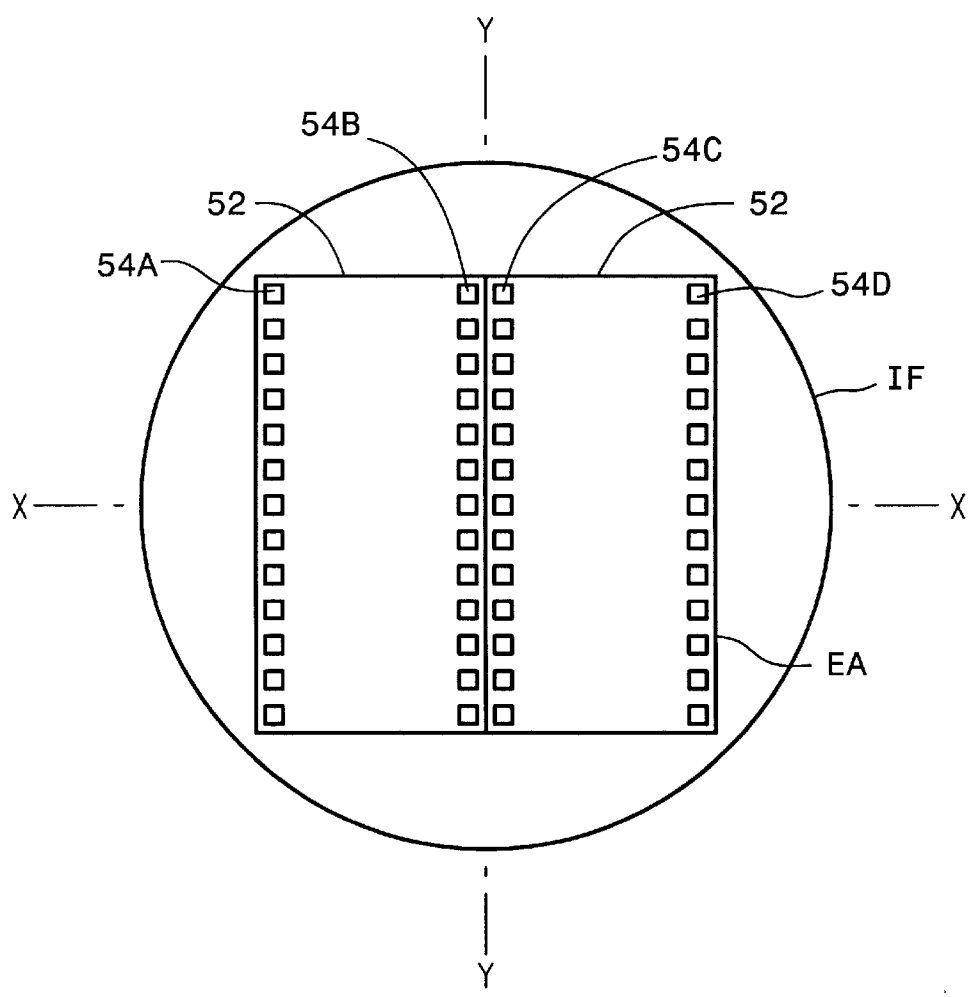
FIG. 3 shows chips on a wafer in a visual field of a projection lens.

FIG. 3 shows chips 52 on the wafer W in an image field IF of the projection lens PL.

Usually, two or more chips 52 are exposed in one exposure area EA (one shot area) on the wafer W in many cases. FIG. 3 shows the case of exposure for two chips.

In this two-chip exposure, the Y or X axis passing through an exposure area center is used as a chip cutting area (scribe line), in the vicinity of which bonding pad areas 54A, 54B, 54C, 54D are aligned as areas intended as continuity areas to be finally used for deriving external wiring. The bonding pad areas 54A–54D have not been used for a purpose other than the purpose of formation of the bonding pads in the conventional art.

In the exposure area, a portion located nearer to the center has better image formation performance and better magnification accuracy. However, the magnification in the X direction may be measured by using marks extending in the Y direction. If they are located in the vicinity of the Y axis, the influence of the magnification does not relate to the positional discrepancy of the marks in the X direction provided that the exposure field is considered as an XY plane. In the same manner, alignment marks for measurement in the Y direction may be located in the vicinity of the X axis. These relationships hold true for marks for registration measurement described below.

FIG. 4 shows examples of various process control marks formed on the bonding pad area 54A by using the reticles having various mark designs.

Figure 4A:
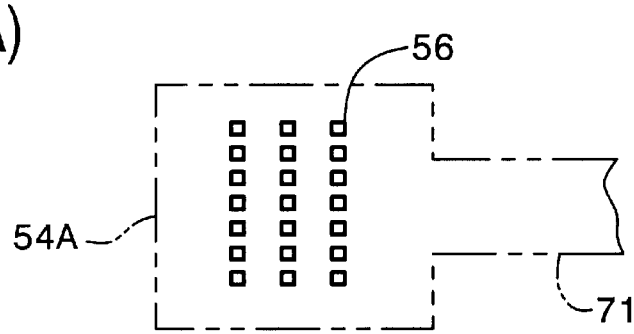
FIGS. 4(A), (B), (C) and (D) show examples of various process control marks formed on a bonding pad area.
Figure 4B:
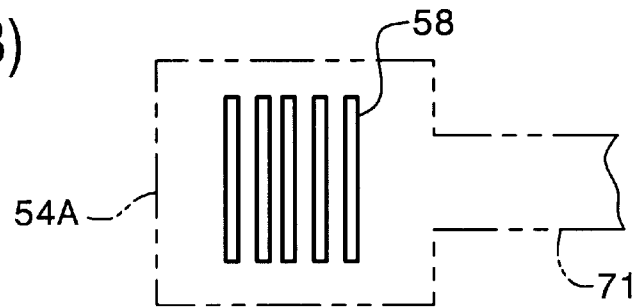

FIGS. 4(A) and (B) show formation of alignment marks 56, 58 on the bonding pad area 54A respectively. These marks 56, 58 are used for measuring the position in the one-dimensional direction. However, it is a matter of course that marks which enable measurement for the two-dimensional position may be formed. These alignment marks are preferably provided at the center of each of the bonding pad areas 54A to 54D because the marks are well covered with the bonding pads as described below, and problems such as short circuit formation are eliminated.

Figure 4C:
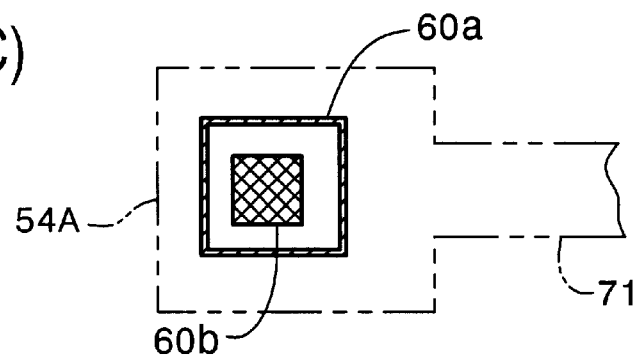

FIG. 4(C) shows formation of a box-and-box mark which is typical and general among marks for registration measurement. In the illustration, reference numeral 60a indicates a process mark, and 60b indicates a resist mark.

Figure 4D:
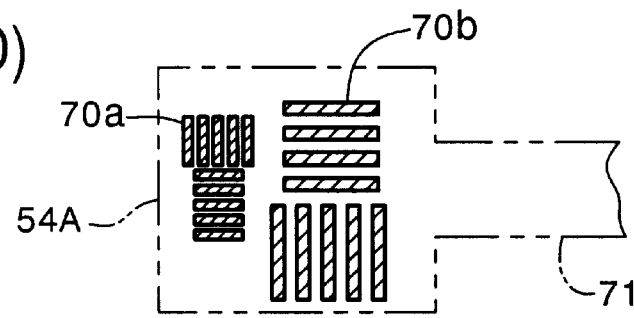

FIG. 4(D) shows formation of a resolution chart to be used for checking focus and exposure time. The illustration shows formation of thin marks 70a and thick marks 70b. The resolution chart is desirably provided in the vicinity of the center of the image field IF, because a portion nearer to the center is apt to be prevented from the influence of aberration of the projection lens in the exposure area. Thus measurement for resolving power and measurement for focusing can be performed accurately.

The marks in FIGS. 4(A), (B), (C) and (D) are advantageously provided at a central portion in the exposure area as described above, because if so, they are apt to be prevented from changes in discrepancy between each of the layers within a chip (rotational discrepancy and magnification discrepancy of the chip). However, the mark in FIG. 4(C) is desirably provided at the bonding pad area 54A (or 54D) located on a corner portion in the exposure area, from a viewpoint on its nature that it is used to detect positional discrepancy between each of the layers (including discrepancy in a rotational direction). The process control marks shown in FIGS. 4(A)–(D) can be formed on the wafer W by using the reticles which have corresponding patterns to these process control marks.

In this embodiment, the marks are formed on the bonding pad areas 54A to 54D in accordance with the lithography step by using the reticles prior to formation of the bonding pads, and necessary processing such as alignment for overlay exposure can be performed by means of the marks of the reticles. Thus even if the variety and the number of process control marks to be used increase in accordance with the requirement for more accurate positional adjustment techniques (alignment techniques) for the reticle and the wafer, automatically focusing techniques (autofocus techniques), and high performance optical techniques, all of the marks can be easily formed on the wafer W. Additionally, the line width of the scribe lines can be made narrow because the marks are formed on the bonding pad areas 54A to 54D. As a result, the efficiency of utilization of areas for forming chips on the wafer W is improved.

As illustrated by phantom lines in FIG. 4(A) to (D), the bonding pads are finally formed on the bonding pad areas 54A to 54D by the lithography step, which are subsequently connected to external wiring 71 through wire bonding. Thus the various process control marks used in the lithography step cannot be seen completely from the outside. Insulating layers are formed between the bonding pads and the process control marks formed prior thereto. Accordingly, it is also possible to form process control marks on areas between the bonding pad areas 54A to 54D (in the vicinity of the bonding pad areas 54A to 54D). However, there is a possibility of incomplete insulation due to partial deficiency of the insulating layer. Taking such a possibility into consideration, if process control marks are formed while spanning the insulating layers and the bonding pad areas 54A to 54D, a current may flow between the bonding pad areas 54A to 54D and a device area which should be essentially insulated. Thus the process control marks are preferably provided on the bonding pad areas 54A to 54D, desirably at the center of each of the bonding pad areas 54A to 54D.

In the embodiment described above, the procedure has been explained in which the alignment marks on the wafer W are detected by using the alignment system of the TTL system to perform positional adjustment of the reticle R and the wafer W during the lithography step. However, instead of the alignment system of the TTL system, the alignment system of the off-axis system as described above can be used to detect the alignment marks on the wafer W.

Figure 5:
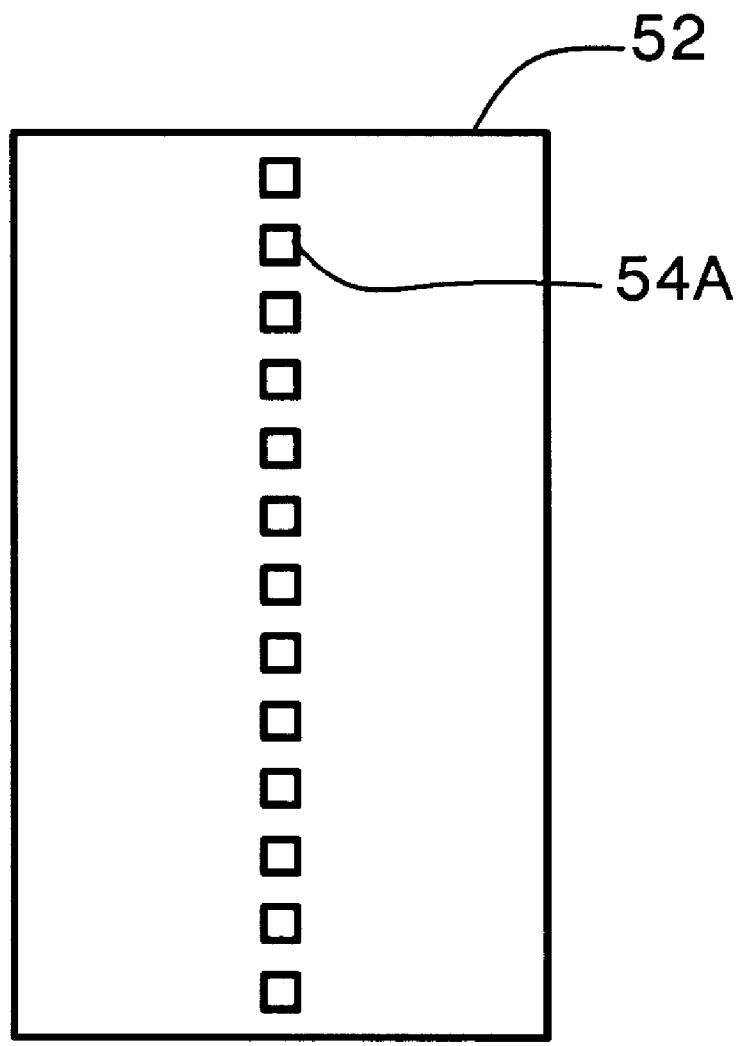
FIG. 5 shows a chip of an LOC structure.

In the embodiment described above, the procedure has been explained by way of example in which the bonding pads are formed at the periphery of the chip. However, it is needless to say that the present invention can be applied to an LOC (lead on chip) structure in which bonding pad areas 54A are aligned on a center line of a chip 52 as shown in FIG. 5.

In the embodiment described above, the procedure has been explained as exemplified by the exposure method of the step-and-repeat system. However, the present invention is not limited thereto, but it can be applied to methods for producing semiconductor devices by using various exposure systems such as the slit scan system, the mirror projection system, the proximity system, and the contact system.

As explained above, according to the present invention, an excellent effect which has not been achieved by the conventional art is provided in that all control marks to be used can be easily imprinted on a wafer, and the line width of scribe lines can be made narrow.

The present invention may be practiced or embodied in other various forms without departing from the spirit or essential characteristics thereof. It will be understood that the scope of the present invention is indicated by the appended claims, and all variations and modifications which fall within the equivalent range of the claims are embraced in the scope of the present invention.

What is claimed is:

1. In a method for producing a circuit-device, a method comprising the steps of:

illuminating a first mask containing a process control mark to transfer the process control mark onto a predetermined area positioned in an exposure area on a substrate, said process control mark being comprised of a resolution chart to be used to check focus and/or exposure time;

detecting the process control mark formed on the predetermined area, and then performing a predetermined process based on a detection result of the process control mark, said predetermined process including a focussing process and/or an exposure time control process;

illuminating a second mask containing a circuit pattern to transfer the circuit pattern onto the exposure area on the substrate after the predetermined process is performed; and forming a bonding pad which is finally connected to an external wiring on the predetermined area after transferring the circuit pattern onto the substrate, so that the process control mark is at least partially covered by the bonding pad.

2. In the method for producing circuit-devices according to claim 1, wherein the predetermined area has a plurality of the bonding pads.

3. In the method for producing circuit devices according to claim 2, wherein the process control mark is formed between areas on which the bonding pads are formed.

4. In the method for producing circuit-devices according to claim 1, further comprising a step of making wire bonding for the bonding pad.

5. In the method for producing circuit-devices according to claim 1, wherein the process control mark is also formed on scribe lines.

6. In the method for producing circuit-devices according to claim 1, wherein the method is practiced by using an exposure system selected from the group consisting of the step-and-repeat system, the slit scan system, the mirror projection system, the proximity system, and the contact system.

7. In the method for producing circuit-devices according to claim 1, wherein the predetermined area is positioned in a central area of the exposure area.

8. In the method for producing circuit-devices according to claim 1, wherein the first mask further contains a circuit pattern.

9. In the method for producing circuit-devices according to claim 8, wherein the second mask is illuminated to transfer the circuit pattern through a projection optical system onto the substrate and the central area of the exposure area corresponds to a central area of an illumination field illuminated by the projection optical system.

10. In the method for producing circuit-devices according to claim 8, wherein a scribe line is formed in the center of the exposure area.

11. In the method for producing circuit-devices according to claim 1, wherein the predetermined area is positioned at a corner of the exposure area.

12. In the method for producing circuit-devices according to claim 1, wherein the exposure area on the substrate has a plurality of divided areas, and the method further comprises forming a circuit-device in each of the divided areas.

13. In the method for producing circuit-devices according to claim 12, wherein the predetermined area is positioned in a central area of the exposure area and positioned in an area corresponding to an end portion of one of the circuit-devices.

14. In the method for producing circuit-devices according to claim 1, further comprising forming an insulating layer on the substrate onto which the process control mark has been transferred, and forming the bonding pad on the insulating layer.

15. In the method for producing circuit-devices according to claim 1, wherein the predetermined area is positioned on a central line of the circuit-device.

16. In the method of claim 1, further comprising producing the circuit-device from the exposed substrate.

* * * * *